United States Patent [19]

McIver et al.

[11] Patent Number: 4,849,847

[45] Date of Patent: Jul. 18, 1989

[54] POWER SUPPLY SWITCH FOR WAFER SCALE APPLICATIONS

[76] Inventors: George W. McIver, 801 N. Paulina, Redondo Beach, Calif. 90277; James B. Cho, 2051 Parker Ct., Simi Valley, Calif. 93065

[21] Appl. No.: 135,476

[22] Filed: Dec. 21, 1987

Related U.S. Application Data

[63] Continuation of Ser. No. 803,707, Dec. 2, 1985, abandoned.

[51] Int. Cl.⁴ .................... H02H 3/16; H02H 7/20
[52] U.S. Cl. .................................... 361/88; 361/42; 361/86; 361/101; 340/650; 324/73 PC; 371/25
[58] Field of Search ................ 361/42, 45, 60, 54–58, 361/86, 88–91, 93, 94, 100, 101; 307/296 R; 340/649–651, 662, 663; 324/73 PC, 51; 323/276–279; 371/15, 21, 24

[56] References Cited

U.S. PATENT DOCUMENTS

| | | | |
|---|---|---|---|
| 4,353,105 | 10/1982 | Black | 361/101 |
| 4,371,824 | 1/1983 | Gritter | 361/18 X |
| 4,441,136 | 4/1984 | Hampshire | 361/88 |
| 4,555,742 | 11/1985 | Gray et al. | 361/101 X |
| 4,646,299 | 2/1987 | Schinabeck et al. | 371/20 |

*Primary Examiner*—A. D. Pellinen
*Assistant Examiner*—Todd E. DeBoer

[57] ABSTRACT

An adjunct switch circuit is provided for detecting power to ground leaks in a portion of a chip circuit and for disabling such circuit portion in the event of a leak. The switch circuit of the invention is particularly useful for Wafer Scale Integration, and is conveniently employed in the testing of chip circuits following manufacturing.

In a preferred embodiment, the switch circuit includes a power supply, including a voltage source and a ground, a reset line for receiving a reset pulse, a first switch, connected in series with one of the power supply lines to the circuit portion ground and inversely responsive to both the reset pulse and the state of the circuit portion ground following termination of the reset pulse, and a second switch, connected between ground and the circuit portion ground and directly responsive to the reset pulse to leak current from the circuit portion ground to ground when turned on by the reset pulse.

20 Claims, 2 Drawing Sheets

POWER SUPPLY SWITCH FOR WAFER SCALE APPLICATIONS

This application is a continuation of application Ser. No. 803,707, filed Dec. 2, 1985, now abandoned.

BACKGROUND OF THE INVENTION

This invention relates to semiconductor chip protection, and, more particularly, to a power supply switch circuit for detecting a ground lead in a circuit and shutting off power to the faulty circuit.

A short, or current leak, between power and ground usually renders a semiconductor circuit useless. Normally, chips which have this problem would be thrown away. However, on a Wafer Scale Integration (WSI) chip, which comprises a number of circuits on a single wafer, one does not want to discard the entire wafer merely because one circuit on the wafer fails. Also, because of the size of the circuits, the probability that some of the circuits will have a gross short between power and ground is greatly increased.

It is necessary to have a way of cutting off power to parts of the circuit where power shorts may exist without affecting other parts of the circuit. Thus, it would be possible to use the other parts of the circuit even if a power short exists in portions of the circuit.

Various protection circuits have been devised for other applications. For example, U.S. Pat. No. 4,078,200 provides a circuit that protects a device from excessive current flow caused by a short circuit. The approach involves limiting the current to the device. However, the disclosed circuit makes no attempt to shut off the current.

U.S. Pat. No. 4,463,270 detects a difference in the relative amplitudes of two voltages, but again does not shut off the current in the event of a short circuit.

U.S. Pat. No. 4,329,600 provides a protection circuit having means for limiting excessive power dissipation in its output stage. When the output buffer is turned on, if the output voltage does not reach the desired level in a certain time, then the circuit creates a power to ground short in order to shut off the output buffer. Clearly, the protection circuit does not eliminate power to ground shorts.

U.S. Pat. No. 4,353,105 provides a circuit that detects latch-up, which results in excessive current drain. The circuit turns off the chip, leaks off the excess charge, and then turns the chip back on. However, this approach does not solve the problem of dealing with a short in a section of a circuit.

Thus, there remains a need to provide a means for detecting a short in a section of a chip circuit and turning that section off permanently.

OBJECTS AND SUMMARY OF THE INVENTION

Accordingly, it is an object of the present invention to provide a circuit for detecting the existence of a power short in a circuit of a semiconductor chip or in a section thereof.

It is another object of the present invention to provide such a detection circuit which also cuts off power to the circuit in the presence of a power to ground leak.

These and further objects of the invention will become more readily apparent upon a consideration of the following commentary taken in conjunction with the appended drawing.

Briefly, a power supply switch circuit is provided in accordance with the invention which detects power to ground leaks in a portion of a circuit and shuts off power to that portion. The power supply switch circuit comprises:

(a) means responsive to an input reset pulse to turn on a switch;
(b) means for sensing a voltage across the switch and for determining whether that voltage is above or below a preset limit, with the former condition indicative of a leakage and the latter condition indicative of a proper functioning circuit portion; and
(c) latch configuration means for cutting power to the circuit portion following termination of the reset pulse in the event the circuit portion evidences leakage and for maintaining power to the circuit portion following termination of the reset pulse in the event the circuit portion is functioning properly.

In a specific embodiment, the power supply switch circuit comprises:

(a) power input means, including a voltage source and ground;
(b) means for receiving a reset pulse;
(c) first switch means, including a first switch, connected in series with one line of the power input means to the circuit portion and inversely responsive to both the reset pulse and the state of the circuit portion power input line following reset; and
(d) second switch means, connected between the power input line and the circuit portion power input line and directly responsive to the reset means.

Advantageously, the power supply switch circuit of the invention is automatic. A chip circuit need not be manually tested, and a laser or other means is not necessary to cut power lines on the chip circuit. Rather, if shorts are detected while the chip circuit is being reset, ground is never supplied to the defective portion. If a gross short develops during operation, the defective circuitry will automatically be disconnected. Thus, production testing of WSI chips is easier. Further, users of the chip may readily fix power to ground shorts without complication.

DETAILED DESCRIPTION OF THE PREFERRED EMBODIMENTS

Figure 1:
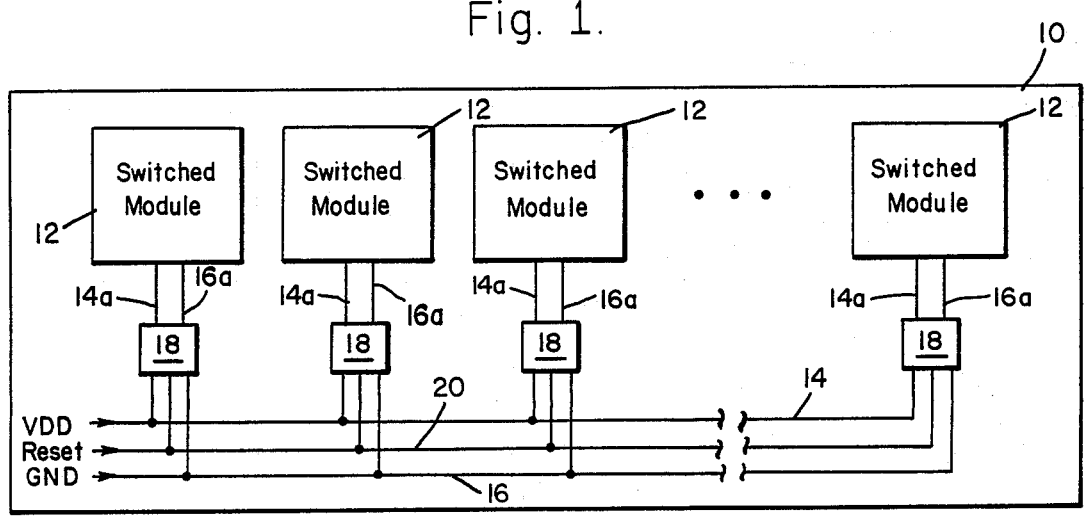
FIG. 1 depicts schematically a plurality of circuit portions, or switched modules, on a wafer, with a power supply switch circuit of the invention associated with each module.

The approach of this invention is to subdivide the wafer scale circuit into smaller portions, or switched modules, in such a way that any one of the switched modules could be lost without adversely affecting overall circuit performance. A power supply switch circuit such as disclosed herein can be placed in either the positive or negative supply lead for each of the switched modules.

The function of the power supply switch circuit of the invention is to sense current drain in the switched module while it is inactive, turning off power to the switched module if the current drain exceeds some reasonable limit in the inactive state.

The current switch of the invention is placed in series with the negative supply if the substrate is N-type; and in series with the positive supply if the substrate is P-type. This constraint arises because the substrate is at one of the supply voltages and cannot be switched.

Referring now to the drawing wherein like numerals of reference refer to like elements throughout, a wafer 10 supports a plurality of switched modules 12, which in totality comprise a circuit. Each module 12 is supplied by a voltage source (VDD) 14 and a ground (GND) 16. The voltage source may be positive or negative, depending on the conductivity type of the wafer 10, as described above.

In accordance with the invention, a power supply switch circuit 18 is provided between the power source 14 and ground 16 and each switched module 12. The power supply switch circuit 18 comprises a circuit means for detecting current leakages in a portion of a circuit, termed herein a switched module 12. Each switched module 12 may be tested and disabled (deprived of power) if a power to ground leak is detected.

A reset pulse, generated externally from the power supply switch circuit 18, is introduced along line 20. The switch circuit 18 comprises means responsive to the reset pulse to turn on a switch 22, means for sensing a voltage across the switch 22 and for determining whether that voltage is above or below a preset value, and latch configuration means for cutting power to the switched module 12 following termination of the reset pulse in the event the switched module 12 evidences leakage and for maintaining power to the switched module 12 following termination of the reset pulse in the event the switched module 12 is functioning properly. By disabling a switched module evidencing leakage, the remainder of the circuit, comprising the remaining switched modules, will continue to function.

Figure 2:
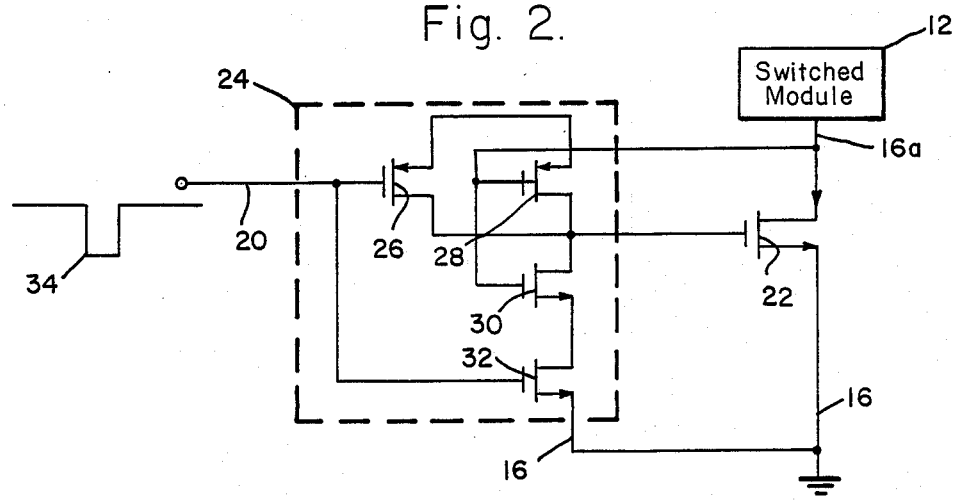
FIG. 2 depicts schematically one embodiment of the power supply switch circuit of the invention, connected in series with the ground side of a switched module.
Figure 3:
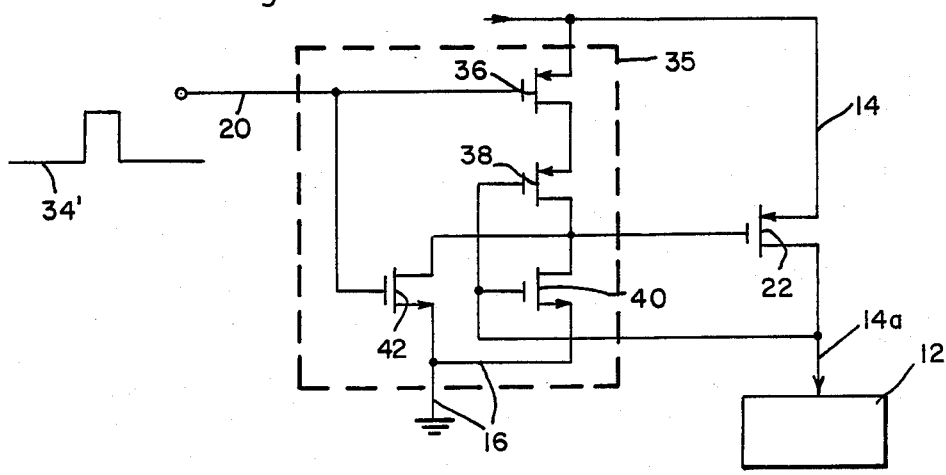
FIG. 3 depicts schematically a second embodiment of the power supply switch circuit of the invention, connected in series with the voltage supply side of a switched module.

The power supply switch circuit 18 may be employed on the ground side (for use with an N-type substrate 10), as depicted in FIG. 2, or on the voltage supply side (for use with a P-type substrate 10), as depicted in FIG. 3.

FIG. 2 shows a simple version of the power supply switch circuit 18, with the switch 22 (N-type transistor) on the ground side 16. A NAND gate 24, for example comprising two P-type transistors 26, 28 and two N-type transistors 30, 32, is responsive to reset pulse 34 along line 20. The NAND gate 24 turns on switch 22 and senses the voltage across the switch 22 between ground line 16a (from the switched module 12) and ground line 16 (from the power supply (not shown)).

If the sensed voltage exceeds a preset value, say 1.5 V, then a power to ground leak is deemed to exist in that switched module. If the sensed voltage is below the preset value, then the switched module is deemed to be functioning properly.

Upon termination of the reset pulse 34, the NAND gate 24 acts to maintain the switch 22 in the open, or off, position, thereby interrupting power to the switched module 12 if a leakage is detected. Otherwise, the NAND gate 24 acts to maintain the switch 22 in the closed, or on, position if the switched module 12 is deemed to be functioning properly.

FIG. 3 shows another simple version of the power supply switch circuit 18, with the switch 22 (P-type transistor) on the voltage side 14, between voltage supply line 14a (to the switched module 12) and the power supply. In this version, a NOR gate 35, for example comprising two P-type transistors 36, 38 and two N-type transistors 40, 42, is responsive to reset pulse 34' along line 20. The operation of this circuit is analogous to that described as above.

Figure 4:
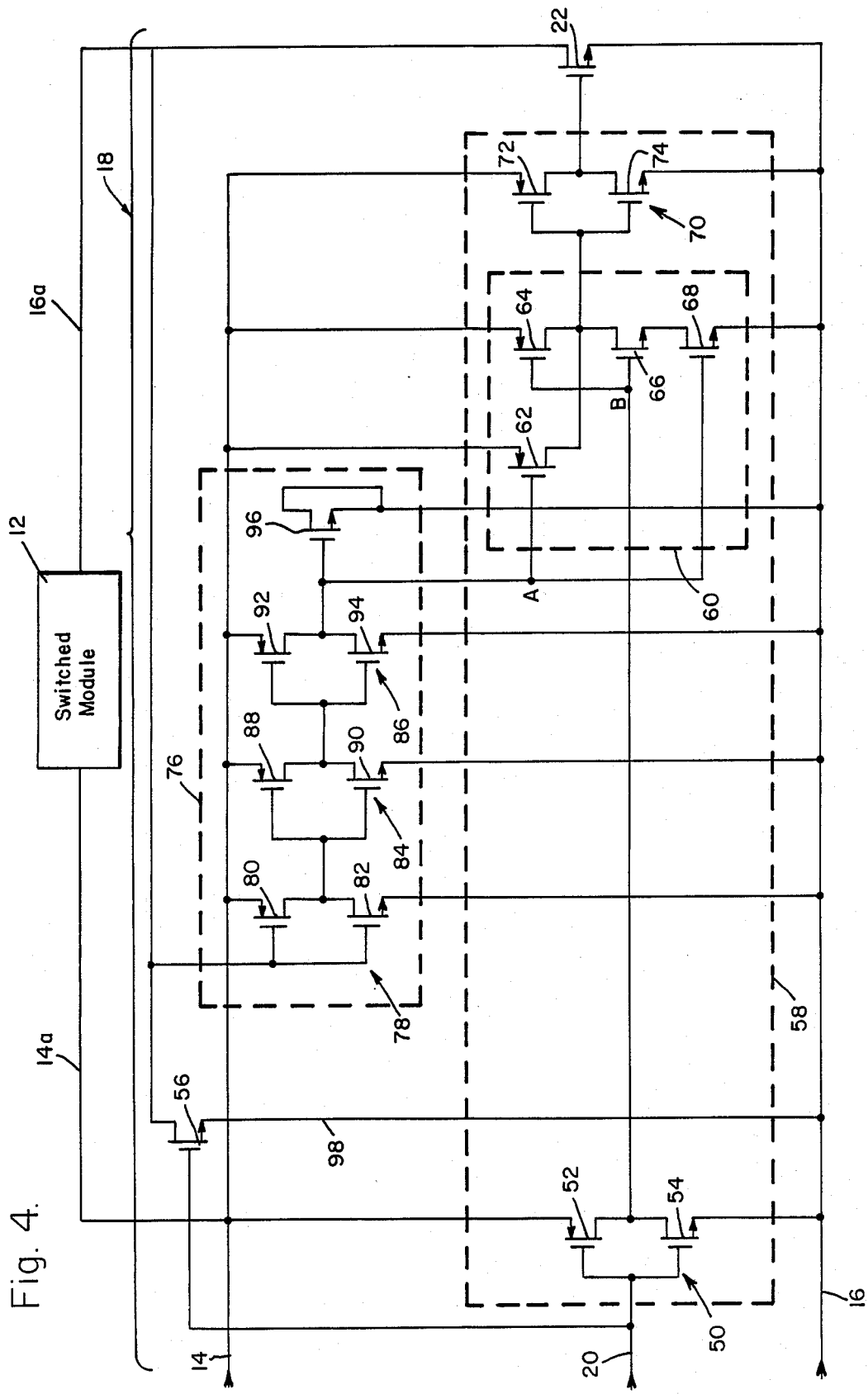
FIG. 4 depicts schematically a preferred embodiment of the power supply switch circuit of the invention.

While adequate for the purposes described, the foregoing power supply switch circuits are sensitive only to gross power to ground leaks. FIG. 4 depicts a more specific and preferred embodiment of the invention, which is sensitive to smaller power to ground leaks.

While having further features, the power supply switch circuit 18 shown in FIG. 4 functions in like respects to the simpler circuits described above. Further, while the power supply switch circuit 18 is shown in connection with interrupting a ground line 16 on an N-type substrate 10, it will be appreciated that, in light of the teachings above, the power supply switch circuit can be suitably employed for interrupting a voltage line 14 on a P-type substrate by interchanging P-type transistors with N-type transistors and by interchanging the voltage and ground connections.

FIG. 4 illustrates a preferred embodiment of the power supply switch circuit 18 of the invention. The purpose of the switch circuit 18 is to interrupt the connection through a switch 22 between ground source 16 and the output 16a to switched module 12 upon detection of a "ground leak". The definition of a ground leak is an electrical current greater than some preset limit to ground from any source of higher potential. The presence of such a leak would cause the line 16a to be above ground electrical potential.

The switch circuit 18 of the invention includes a power input means, including voltage source 14 and ground 16. The voltage source is also connected to the switched module 12 by line 14a. The ground 16 is connected with the ground 16a of the switched module 22 through first switch 22. Since ground 16a may "float" during operation of the switched module 12, it will be referred to herein as a pseudo-ground. Also, it will be recalled that the switched module 12 being controlled may comprise a portion of a chip circuit. Thus, it is contemplated that there may be as many power supply switch circuits 18 on a wafer 10 as there are switched modules 12 to control, as shown in FIG. 1.

The switch circuit 18 also includes means 20 for receiving a reset pulse. Typically, the height of the pulse is about 5 V, as is commonly employed in chip circuits. The width of the pulse is conveniently about 1 msec. However, shorter times may be employed. The pulse may be generated by mechanical activation, such a pushing a button, or may be generated by automatic control means common in the art.

First switch 22 is provided between the ground 16 of the switch circuit 18 and the pseudo-ground 16a. The switch is a large switch, capable of handling up to about 0.5 A. The switch 22 is inversely responsive to both the reset pulse and the state the pseudo-ground 16a is in following termination of the reset pulse.

In particular, the switch 22 is turned off when the reset pulse is turned on. When the reset pulse is turned off, the condition of switch 22 is then determined by the state of the pseudo-ground 16a. If the pseudo-ground 16a is "low" (close to zero), indicating a non-short condition in the switched module 12, then switch 22 will be turned on. If the pseudo-ground 16a is "high" (some positive value, as described in further detail below), then the switch 22 will remain off.

In order for the switch 22 to be turned off when the reset pulse is turned on, an inverter 50 is logically required. Inverter 50 comprises a P-type transistor 52 and an N-type transistor 54, connected in well-known configuration to achieve this purpose.

A second switch 56 is connected between the ground 16 of the switch circuit 18 and the pseudo-ground 16a of the switched module 12. This second switch 56 is responsive only to the reset pulse, turning on when the reset is "high" or on and turning off when the reset pulse is "low" or off.

Associated with the first switch 22 is switch enabling means 58, which senses the states of the reset pulse and of the pseudo-ground 16a. Preferably, the switch enabling means 58 includes a NAND gate 60 comprising two P-type transistors 62, 64 and two N-type transistors 66, 68, connected in a conventional fashion to accept inputs from the voltage source 14, ground 16, pseudo-ground 16a (input A) and reset pulse line 20 (input B).

Only if there is a high signal at both A and B inputs will the NAND gate 60 be activated, outputting a signal which is internally inverted to a low state. The low signal is then passed through an inverter 70, comprising P-type transistor 72 and N-type transistor 74, which outputs a high signal to the first switch 22, turning it on. In the on condition, the ground 16 is connected to the pseudo-ground 16a of the switched module 12, thereby pulling the pseudo-ground to ground state.

A delay means 76 is preferably employed to delay the signal from the pseudo-ground 16a, to ensure that a steady signal is impressed on the NAND gate 60 after the reset pulse is turned off. The delay means 76 comprises a first inverter 78, comprising a P-type transistor 80 and an N-type transistor 82. The first inverter 78 is ratioed to turn over at about 1.5 V. This is done by providing a high ratio NMOS transistor 82 (a high ratio of channel width to channel length), compared with PMOS transistor 80, as is well-known.

The output from the first inverter 78 is fed to a second inverter 84, which is logically required for use of a third inverter 86, employed to delay the signal from the pseudo-ground 16a to the input A of the NAND gate 60. The second inverter 84 comprises a P-type transistor 88 and an N-type transistor 90, coupled in well-known configuration. The output from the second inverter 84 is fed to the third inverter 86.

The third inverter 86 comprises a P-type transistor 92 and an N-type transistor 94, ratioed for time delay. This is done by providing a low ratio NMOS transistor 94, compared with the PMOS transistor 92. The configuration of the two transistors to accomplish such time delay is well-known and forms no part of this invention. Preferably, the time delay is at least about 6 nsec for an appropriate margin of error. Such time delay is necessary in order to ensure that the input to NAND gate 60 is stable for several nsec following termination of the reset pulse. The time delay provides adequate time for the NAND gate 60 to determine the sense of capacitive element 96, which conveniently comprises an MOS transistor configured as a capacitor. The capacitance is about 1 pF.

The purpose of the inverter 78 is to pull down its output voltage quickly if its input voltage is over the preset limit, here, 1.5 V. The inverter 78 outputs a voltage of 5 V when the input is less than about 1.5 V and outputs a voltage of 0 V when the input is greater than about 1.5 V.

The inverter 86 is relatively insensitive to changes in voltage. Thus, the capacitive element 96 may be charged relatively fast through the PMOS transistor 92, but is only slowly discharged through NMOS transistor 94.

Since one use of the power supply switch circuit 18 of the invention is to check switched modules 12 following manufacturing and prior to actual use, this function will be described first.

Before reset, the second switch 56 is turned off. The state of the first switch 22 is immaterial. A reset pulse, having the characteristics described above, is generated on line 20. During the approximately 1 msec duration, the switched module 12 is inactivated, the first switch 22 is turned off and the second switch 56 is turned on.

Any charge stored in the pseudo-ground 16a is discharged along line 98 to ground 16. If there is no power to ground leakage in the switched module 12, then pseudo-ground 16a goes to ground potential (typically about 0 V). Whatever state the pseudo-ground 16a reaches is stored in the capacitive element 96. If a high voltage condition on pseudo-ground 16a exists (greater than about 1.5 V), then 0 V is stored on the capacitive element 96. If a low voltage condition on pseudo-ground 16a exists (less than about 1.5 V), then the voltage stored on the capacitive element 96 is 5 V.

After 1 msec, the reset pulse goes low, turning off second switch 56, which interrupts charge flowing along the leakage path 98. First switch 22 is available to turn on, since input B is now "high". If the charge on the capacitive element 96 is also "high" (as a result of low voltage on the pseudo-ground 16a), then the NAND gate 60 functions to send a signal to the first switch 22, turning it on and permitting connection between ground 16 and pseudo-ground 16a. Consequently, the switched module 12 is enabled.

On the other hand, if the charge on the capacitive element 96 is "low" (as a result of high voltage on the pseudo-ground), then the NAND gate 60 does not turn on the first switch 22, and consequently, the switched module 12 is disabled.

It will be appreciated that during subsequent operation of the switched module 12 the switch circuit 18 is relatively insensitive to any power to ground leaks that may develop in the switch §odule 12. However, if the user of the wafer 10 incorporating the plurality of switched modules 12, each accompanied by a power supply switch circuit 18 of the invention, suspects such a later developing power to ground leak, the user may activate the reset pulse. Doing so will initialize the switched module 12, thus destroying any data stored therein. However, the circuit will operate anew, and any switched modules 12 which have developed such leaks will be removed from the total chip circuit.

While the switch circuit 18 of the invention is relatively insensitive to any power to ground leaks, nevertheless, if a severe enough short develops in a switched module 12, the first switch 22 will turn off, as will be apparent from a consideration of the foregoing.

The advantage of the invention is that it senses ground leaks at a time when the chip circuit is not operating, namely, when the reset pulse is inputted to the power supply switch circuit 18. Presumably, the chip circuit is provided with means responsive to the same reset signal to interrupt its operation.

As a consequence of the use of the switch circuit 18 of the invention, power consumption by a plurality of switched modules 12 forming a chip circuit employed in wafer scale integration is minimized. This is accomplished by isolating irretrievably faulty portions of the wafer 10 from the power source. However, while the invention has been described in terms of protecting chip circuits in wafer scale integration, it will be appreciated that the switch circuit of the invention will be generally useful in ordinary large scale integration circuits.

Other configurations employing the teachings of the invention may also be developed. For example, inverters 50, 70 and 84 may be eliminated. Inverter 86 may be re-ratioed so that the PMOS transistor 92 has a low ratio, while the NMOS transistor 94 has a conventional ratio. The NAND gate 60 may be replaced by a NOR gate. Consequently, the combination of a low signal from the reset pulse line 20 (indicative of no reset pulse) and a low signal from the pseudo-ground 16a (indicative of no power to ground leaks in the switched module 12) will act to turn on the first switch 22 and hence provide power to the switched module 12.

Thus, there has been disclosed a power supply protection switch circuit for detecting power to ground leaks in portions, or switched modules, of chip circuitry and for removing such portions from the chip circuitry in the event of such a leak. Many changes and modifications of an obvious nature will make themselves available to those of ordinary skill in the art, and all such changes and modifications are considered to be within the scope of the invention, as defined by the appended claims.

What is claimed is:

1. A power supply switch circuit formed as complementary metal-oxide semiconductor (CMOS) circuitry and used in detecting power-to-ground leaks in a portion of a semiconductor chip circuit, the power supply switch comprising:
   (a) first and second power input lines used in supplying power to a portion of a semiconductor circuit;
   (b) a reset line, used in receiving a reset signal pulse used to initiate detection of ground leakage currents from the circuit portion;
   (c) first CMOS switch means, including a first switch connected in series with one of the first and second power input lines, the first switch means functioning to open the first switch in response to the presence of a reset signal pulse on the reset line;
   (d) second CMOS switch means functioning in response to the presence of the reset pulse, to generate a control signal indicative of whether the voltage across the first switch in its open condition exceeds a predetermined threshold; and
   (e) means connecting the control signal generated by the second CMOS switch means to the first CMOS switch means, which functions to leave the first switch open at the end of the reset pulse if the voltage across the first switch in its open condition exceeds the predetermined threshold.

2. The switch circuit of claim 1 in which one of the power lines is a ground line and the first switch is connected in series with the ground line.

3. The switch circuit of claim 1 in which one of the power lines is a ground line and the first switch is connected in series with the power line that is not the ground line.

4. A power supply switch circuit used in detecting power-to-ground leaks in a portion of a semiconductor chip circuit, the power supply switch comprising:
   (a) first and second power input lines used in supplying power to a portion of a semiconductor circuit;
   (b) a reset line, used in receiving a reset signal pulse used to initiate detection of ground leakage currents from the circuit portion;
   (c) first switch means, including a first switch connected in series with one of the first and second power input lines, the first switch means functioning to open the first switch in response to the presence of a reset signal pulse on the reset line;
   (d) second switch means functioning in response to the presence of the reset pulse, to generate a control signal indicative of whether the voltage across the first switch in its open condition exceeds a predetermined threshold; and
   (e) means connecting the control signal generated by the second switch means to the first switch means, which functions to leave the first switch open at the end of the reset pulse if the voltage across the first switch in its open condition exceeds the predetermined threshold;
   and wherein the first switch means includes a logic gate performing an AND function and having one input derived from the reset line and one input derived from the control signal from the second switch means, and an output coupled to the first switch, to switch it to the closed condition only when the inputs indicate that the reset signal pulse is complete and that the voltage across the first switch in the open condition did not exceed the predetermined threshold.

5. A power supply switch circuit formed as complementary metal-oxide semiconductor (CMOS) circuitry and used in detecting power-to-ground leaks in a portion of a semiconductor chip circuit, the power supply switch comprising:
   (a) first and second power input lines used in supplying power to a portion of a semiconductor circuit;
   (b) a reset line, used in receiving a reset signal pulse used to initiate detection of ground leakage currents from the circuit portion;
   (c) first CMOS switch means, including a first switch connected in series with one of the first and second power input lines, the first switch means functioning to open the first switch in response to the presence of a reset signal pulse on the reset line;
   (d) second CMOS switch means functioning in response to the presence of the reset pulse, to generate a control signal indicative of whether the voltage across the first switch in its open condition exceeds a predetermined threshold; and
   (e) means connecting the control signal generated by the second CMOS switch means to the first CMOS switch means, which functions to leave the first switch open at the end of the reset pulse if the voltage across the first switch in its open condition exceeds the predetermined threshold;
   and wherein the second CMOS switch means includes delay means to ensure that the control signal is still available at the first switch means after termination of the reset signal pulse.

6. A power supply switch circuit used in detecting power-to-ground leaks in a portion of a semiconductor chip circuit, and adapted to disable the circuit portion upon the detection of such leaks, the power supply switch comprising:

(a) a power input line and a ground line, used in supplying power to a portion of a semiconductor chip circuit;

(b) a reset line, used in receiving a reset signal pulse used to initiate detection of ground leakage currents from the circuit portion;

(c) first switch means, including a first switch connected in series between the ground line and a ground terminal of the circuit portion, the first switch means functioning to open the first switch in response to the presence of a reset signal pulse on the reset line;

(d) second switch means functioning in response to the presence of the reset pulse, to generate a control signal indicative of whether the voltage across the first switch in its open condition exceeds a predetermined threshold; and (e) means connecting the control signal generated by the second switch means to the first switch means, which functions to leave the first switch open at the end of the reset pulse if the voltage across the first switch in its open condition exceeds the predetermined threshold;

(f) first switch turn-on means included in the first switch means, and responsive to the control signal and the simultaneous absence of the reset signal pulse, to turn on the first switch if the voltage across it in the open condition does not exceed the threshold value; and (g) delay means included in the second switch means, used in delaying the control signal to ensure that it will persist after the reset signal has terminated, the delay means including a first inverter ratioed to turn over at the predetermined voltage threshold, a second inverter to recondition the control signal, a third inverter ratioed to delay the signal a predetermined time, and a capacitive element adapted to store the state of the control signal.

7. The switch circuit of claim 6 in which the reset signal pulse has a voltage approximately that of the voltage source and a duration of less than about 1 msec.

8. The switch circuit of claim 6 in which the predetermined voltage threshold is about 1.5 volts.

9. The switch circuit of claim 6 in which the predetermined time is greater than about 6 nanoseconds.

10. A method of testing a portion of a chip circuit on a substrate, referred to in this claim as a circuit portion, to determine if the circuit portion evidences a power-to-ground leak, and to isolate the circuit portion in the event a leak is detected, the method comprising:

(a) receiving a reset pulse of a predetermined voltage and duration;

(b) as a result of the reset pulse, turning off a first switch connected in series with a power supply line to the circuit portion, thereby disconnecting the circuit portion from the power supply, and turning on a second switch connected in parallel with the first switch, thereby permitting any charge accumulated on the power supply line to the circuit portion to discharge through the second switch;

(c) following the reset pulse, storing the inverted state of the power supply line to the circuit portion;

(d) feeding the stored inverted state of the power supply line to a first input line;

(e) feeding the inverted state of the reset pulse to a second input line;

(f) if both input lines are in a "high" condition, indicating that a voltage on the supply line to the circuit portion is below a preset value and the reset pulse is off, generating a signal to turn on the first switch, to reconnect the power supply line to the circuit portion; and (g) if the first input line is in a "low" condition, indicating that a voltage on the supply line to the circuit portion is above the preset value, thus constituting a leak condition, then maintaining the first switch in an off state, thereby maintaining the disconnected condition and disabling the circuit portion.

11. A power supply switch circuit used in detecting power supply leakages in a semiconductor circuit module and for shutting off power to the module upon detection of such a leakage, the power supply switch comprising:

(a) a power supply connected to the module;

(b) a first switch connected in series with the power supply line;

(c) a second switch connected in parallel with the first switch;

(d) means responsive to a reset pulse used in switching the first switch to the off state and the second switch to the on state for the duration of the reset pulse;

(e) means operative during the reset pulse, used in generating a control signal indicative of whether the voltage across the first switch in the off state exceeds a preselected threshold value; and (f) logic means responsive to the control signal and to the reset pulse, switching the first switch on at the end of the reset pulse only if the voltage across the first switch in the off state is below the threshold value, indicating no detected leaks.

12. A power supply switch circuit as defined in claim 11, wherein the means for generating a control signal includes:

delay means to ensure that the control signal is available to the logic means immediately after the end of the reset pulse.

13. A power supply switch circuit as defined in claim 11, wherein the logic means includes:

a NOR gate having a first input derived from the reset pulse such that the first input is in a "low" condition if the reset pulse has ended, a second input derived from the control signal such that the second input is in a "low" condition if the detected voltage across the first switch in the off state is below the threshold value, and an input that is in a "high" condition, for switching the first switch on, only if both of the inputs are "low."

14. A power supply switch circuit as defined in claim 12, wherein the logic means includes:

a logic gate performing an AND function and having a first input derived from the reset pulse such that the first input is in a low condition if the reset pulse has ended, a second input derived from the control signal such that the second input is in a "high" condition if the detected voltage across the first switch in the off state is below the threshold value, and an output that is in a "high" condition, used in switching the first switch on, only if both of the inputs indicate that the reset signal pulse is complete and that the voltage across the first switch in the open condition did not exceed the predetermined threshold.

15. A method used in testing a circuit module of an integrated circuit chip to determine if the module evidences a power-to-ground leak, and in isolating the module in the event that such a leak is detected, the method comprising:
- (a) receiving a reset pulse of a predetermined voltage and duration;
- (b) in response to the reset pulse, turning off a first switch connected in a power supply line to the module, and turning on a second switch connected in parallel to the first switch;
- (c) detecting the voltage across the first switch in the off state;
- (d) generating a control signal indicative of whether the voltage across the first switch in the off state is above a predetermined threshold value; and
- (e) after the reset pulse, switching the first switch on again only if the control signal indicates that the voltage across the first switch in the off state was below the predetermined threshold, indicating no leakage conditions.

16. A power supply switch circuit used in detecting power-to-ground leaks in a portion of a semiconductor chip circuit, the power supply switch comprising:
- (a) first and second power input lines used in supplying power to a portion of a semiconductor circuit;
- (b) a reset line, used in receiving a reset signal pulse used to initiate detection of ground leakage currents from the circuit portion;
- (c) first switch means, including a first switch connected in series with one of the first and second power input lines, the first switch means functioning to open the first switch in response to the presence of a reset signal pulse on the reset line;
- (d) second switch means functioning in response to the presence of the reset pulse, to generate a control signal indicative of whether the voltage across the first switch in its open condition exceeds a predetermined threshold; and
- (e) means connecting the control signal generated by the second switch means to the first switch means, which functions to leave the first switch open at the end of the reset pulse if the voltage across the first switch in its open condition exceeds the predetermined threshold;

and wherein the first switch means includes a NAND gate having two inputs, one input being an inverted signal from the reset pulse, the first input being "high" when the reset pulse is over, and the other input being derived from the control signal such that the second input is "high" when the voltage across the first switch in the off state is below the threshold value, the NAND gate providing an output signal to switch the first switch on only when both inputs are in the "high" condition.

17. A power supply switch circuit used in detecting power-to-ground leaks in a portion of a semiconductor chip circuit, the power supply switch comprising:
- (a) first and second power input lines used in supplying power to a portion of a semiconductor circuit;
- (b) a reset line, used in receiving a reset signal pulse used to initiate detection of ground leakage currents from the circuit portion;
- (c) first switch means, including a first switch connected in series with one of the first and second power input lines, the first switch means functioning to open the first switch in response to the presence of a reset signal pulse on the reset line;
- (d) second switch means functioning in response to the presence of the reset pulse, to generate a control signal indicative of whether the voltage across the first switch in its open condition exceeds a predetermined threshold; and
- (e) means connecting the control signal generated by the second switch means to the first switch means, which functions to leave the first switch open at the end of the reset pulse if the voltage across the first switch in its open condition exceeds the predetermined threshold;

and wherein the second switch means includes delay means to ensure that the control signal is still available at the first switch means after termination of the reset signal pulse, and the delay means includes a first inverter ratioed to turn over at the predetermined voltage threshold, a second inverter to delay the control signal for a predetermined time, and a storage means for storing the state of the control signal.

18. The switch circuit of claim 17 in which the predetermined voltage threshold is about 1.5 volts.

19. The switch circuit of claim 17 in which the predetermined time is greater than about 6 nanoseconds.

20. The switch circuit of claim 17 in which the storage means includes a capacitive element having a capacitance of about 1 pF.

* * * * *